United States Patent [19]
Batlogg et al.

[11] Patent Number: 5,767,673
[45] Date of Patent: Jun. 16, 1998

[54] ARTICLE COMPRISING A MANGANITE MAGNETORESISTIVE ELEMENT AND MAGNETICALLY SOFT MATERIAL

[75] Inventors: Bertram Josef Batlogg, Murray Hill; Sang-Wook Cheong, Chatham; Harold Yoonsung Hwang, Hoboken, all of N.J.

[73] Assignee: Lucent Technologies Inc., Murray Hill, N.J.

[21] Appl. No.: 663,851

[22] Filed: Jun. 27, 1996

Related U.S. Application Data

[60] Provisional application No. 60/003,742 Sep. 14, 1995.

[51] Int. Cl.$^6$ .............................. G01R 33/09; G11B 5/39; H01L 43/08
[52] U.S. Cl. ...................... 324/252; 338/32 R; 360/113; 257/422
[58] Field of Search ..................... 324/252; 338/32 R; 360/113; 257/421, 422, 425

[56] References Cited

U.S. PATENT DOCUMENTS

| | | | |
|---|---|---|---|
| 4,024,489 | 5/1977 | Bajorek et al. | 324/252 |
| 4,827,218 | 5/1989 | Meunier et al. | 324/252 |

OTHER PUBLICATIONS

"Giant negative Magnetoresistance in Perovskitelike La$_{2/3}$BA$_{1/3}$MnOd$_x$ Ferromagnetic Films", R. von Helmolt et. al., *Physical Review Letters*, vol. 71, No. 14, 4 Oct. 1993, pp. 2331–2333.

"Thousandfold Change in Resistivity in Magnetoresistive La–Ca–Mn–O Films", S. Jin et. al., *Science*, vol. 264, 15 Apr. 1994, pp. 413–415.

"Giant Magnetresistance in Pyrochlore Tl$_{2-x}$In$_x$Mn$_2$O$_7$", by S–W. Cheong et al., *Solid State Communications*, vol. 98, No. 2, pp. 163–166, 1996, pp. 163–166.

"Introduction to Magnetic Materials", by B.D. Cullity, Addison–Wesley, 1972, pp. 18–21.

"Lattice Effects on the Magnetoresistance in Doped LaMnO$_3$," by H. Y. Hwang et al., *Physical Review Letters*, vol. 75, No. 5, 31 July 1995, pp. 914–917.

*Primary Examiner*—Walter E. Snow
*Attorney, Agent, or Firm*—Eugen E. Pacher

[57] ABSTRACT

Magnetoresistive elements according to this invention comprise magnetically soft material in close proximity to the magnetoresistive material, exemplarily a perovskite manganite. The combination results in magnetic field "amplification", with large resistance changes attainable at relatively low applied fields. The invention exemplarily is embodied in magnetic sensors, e.g., magnetoresistive read/write heads.

9 Claims, 3 Drawing Sheets

ARTICLE COMPRISING A MANGANITE MAGNETORESISTIVE ELEMENT AND MAGNETICALLY SOFT MATERIAL

CROSS-REFERENCE TO RELATED APPLICATION

This application claims priority of Provisional Application Ser. No. 60/003,742 which was filed on Sep. 14, 1995.

FIELD OF THE INVENTION

This invention pertains to articles (e.g., a magnetic read/write head or other magnetic sensor) that comprise a quantity of magneto-resistive material, exemplarily a perovskite manganite.

BACKGROUND OF THE INVENTION

The magnetoresistance of a material is the difference between the resistivity $\rho(H)$ of the material in an applied magnetic field (H) and the resistivity $\rho_0$ of the material in the absence of the applied field. This difference $\Delta\rho$ is typically normalized (e.g., by dividing by $\rho_0$ or by $\rho(H)$) and expressed as a magnetoresistance ratio in percent. Herein, "MR" will stand for "magnetoresistance" and closely related terms such as "magnetoresistive".

Recently, giant MR ratios were observed in perovskite manganites, exemplarily in La-Ca-Mn-oxide and in thin films of La-Ba-Mn-oxide. See, for instance, R. von Helmholt et al., *Physical Review Letters*, Vol. 71, p. 2331-2333, Oct. 4, 1993.

Co-assigned U.S. patent application Ser. No. 08/228,168, filed Apr. 15, 1994 by S. Jin et al., (which is a continuation-in-part of Ser. No. 08/154,766, now abandoned) discloses perovskite manganites that can exhibit a MR ratio of 200% or more (in absolute value) at room temperature, typically attained at relatively high fields, e.g., at 6 Tesla. The '766 application also discloses a method of making such material. Co-assigned U.S. Pat. No. 5,411,814, discloses improved MR materials based on La-Ca-Sr-Mn-oxide or La-Ca-Ba-Mn-oxide, which can exhibit more sensitive MR behavior in low magnetic fields. See also S. Jin et al., *Science*, Vol. 264, p. 413 (1994), which shows very high MR ratios in excess of −100,000% at ~77K. The paper inter alia also discloses that very high MR values of La-Ca-Mn-oxide typically are observed only in epitaxial films on single crystal substrates. Co-assigned U.S. patent application No. 08/315,160, filed Sep. 29, 1994 by S. Jin et al., discloses polycrystalline materials with high MR ratios. Novel devices that can advantageously utilize materials that exhibit very high MR ratios are disclosed, for instance, in the co-assigned U.S. patent applications of Ser. Nos. 08/176,366 (Dec. 30, 1993; S. Jin et al.), 08/220,318 (Mar. 30, 1994; S. Jin et al.), 08/220,768 (Mar. 31, 1994; S. Jin et al.), and 08/234,528 (Apr. 28, 1994; G. Blonder et al.). All of the above cited applications and the patent are incorporated herein by reference.

Of course, the high MR ratio materials can be utilized also in known devices such as magnetic recording and/or playback devices and, more generally, in magnetic-field sensing devices.

For many technological applications of high MR ratio materials it is at least highly desirable that a sufficiently high MR ratio is achieved at relatively low magnetic fields, inter alia, in order to avoid the need for bulky and costly biasing magnets. This application discloses apparatus that comprises material combinations that can exhibit high MR ratios at relatively low magnetic fields. In preferred embodiments these high MR ratios are exhibited at temperatures at or near room temperature.

SUMMARY OF THE INVENTION

In a broad aspect the invention is embodied in articles that comprise improved MR field sensing means. The embodiments of the invention utilize magnetic field amplification to achieve a desired MR characteristic.

More specifically, an article according to the invention comprises MR material, means for flowing a current through the MR material such that a voltage difference results across at least a portion of the material, and means that are responsive to said voltage difference.

Significantly, the article further comprises a magnetically soft material (typically intrinsic coercive field $H_c \leq 100$ Oe) disposed in close proximity to the magnetoresistive material such that the magnetoresistive material experiences an effective magnetic field that is greater than an applied (typically varying in space and/or time) magnetic field that is to be sensed. A non-varying magnetic field (to be referred to as the "biasing field") typically is applied to shift the operating point in known fashion. The biasing field typically is provided by a biasing magnet, but could be Earth's magnetic field.

DETAILED DESCRIPTION OF SOME PREFERRED EMBODIMENTS

A significant aspect of our invention is the discovery that the low field MR ratios of many materials can be substantially increased by placing soft magnetic material (typically ferromagnetic, but ferrimagnetic materials are not excluded. Herein, "magnetic" is meant to collectively refer to ferromagnetic and ferrimagnetic material) in proximity to the MR material. We intend herein "MR ratio" to refer to the absolute value of the MR ratio. The discussion below is substantially in terms of a particular class of MR materials, namely, perovskite manganites. However, those skilled in the art will recognize that the invention is not thus limited but can at least in principle be utilized also with other MR materials, e.g., with a pyrochlore such as $Tl_2Mn_2O_7$, or, more generally, $Tl_{2-x}In_xMn_2O_7$ (0<x<2). See, for instance, S-W. Cheong et al., *Solid State Communications*, Vol. 98(2), p. 163 (1996).

Figure 1:
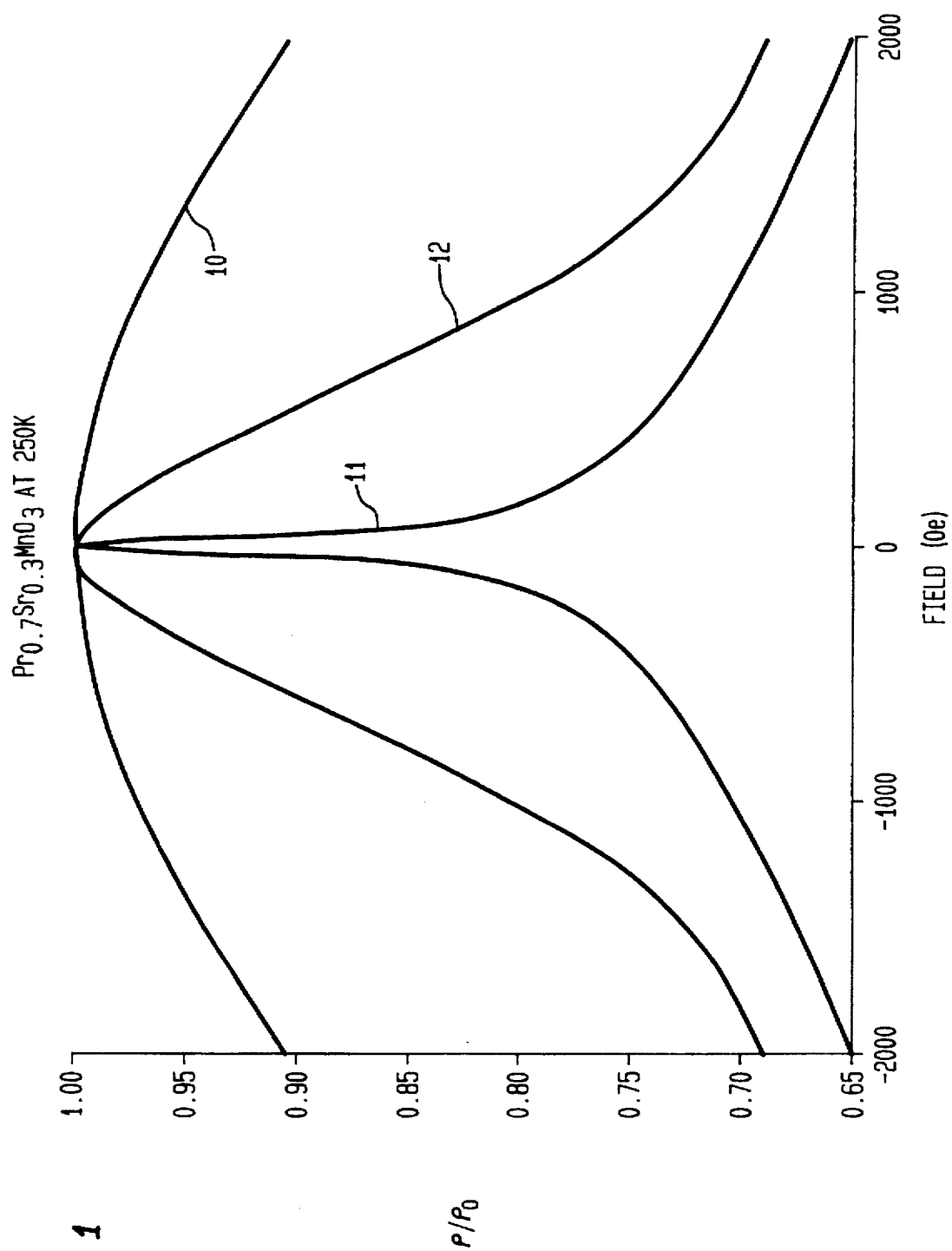
FIG. 1 shows data on resistivity vs. magnetic field for samples of $Pr_{0.7}Sr_{0.3}MnO_3$.

FIG. 1 illustrates our discovery, by showing the resistance of an exemplary perovskite manganite body $(Pr_{0.7}Sr_{0.3}Mn_{0.3})$ at 250K as a function of applied magnetic field. Curve 10 shows the resistance of a sintered sample of the material, with no soft magnetic material in proximity to the sample, and curves 11 and 12 show the resistance of the same sample, disposed between two magnetic bodies $(MnFe_2O_4)$ such that the sample is within the magnetic field of the magnetic bodies. For curve 11 the two bodies were of bar-like geometry (1.5×1.5×15 mm), and for curve 12 the two bodies were of plate-like geometry (4×4×1.5 mm). As can be seen, the details of the MR as a function of applied field depend on the shape of the magnetic body, in consequence of the well known demagnetization factor due to the shape of magnetic bodies. For curves 11 and 12 the applied magnetic field was along the axis of the bars and normal to the plates, respectively.

The striking increase in low field MR that can result from placement of soft magnetic material in proximity to the MR element is evident from the exemplary data of FIG. 1.

Embodiments of the invention typically comprise magnetic material that inherently exhibits a magnetization curve with relatively low coercive field $H_c$ and saturation field $H_s$. Such materials are generally referred to as "soft" magnetic materials. The magnetization curve of magnetic materials is well known to those skilled in the art and does not require detailed discussion. See, for instance, "Introduction to Magnetic Materials," B. D. Cullity, Addison-Wesley, 1972, especially pages 18–21.

Many soft magnetic materials are known, and those skilled in the art will be readily able to select a material that meets their particular requirements. In general, such materials will intrinsically have $H_c \leq 100$ Oe (frequently less than 20 or even 1 Oe), with saturation magnetization $M_s$ intrinsically reached in relatively low magnetic field. References to "intrinsic" parameters such as $M_s$, $H_s$ and $H_c$ refer to the parameters after correction for demagnetization effects. As those skilled in the art know, the observed value of e.g., $H_s$ depends strongly on the shape of the magnetic body, and typically will be in a range of 30–1000 Oe. Exemplary of soft magnetic materials are ferrites such as $Mn_{1-x}Zn_xFe_2O_4$.

It will typically be advisable to select the MR material such that high MR sensitivity (defined as the absolute value of $d/dH(\Delta\rho/\rho(H))$) is obtained at a predetermined temperature, e.g., at room temperature. High sensitivity is generally obtained for the field region below $H_s$.

Figure 2:
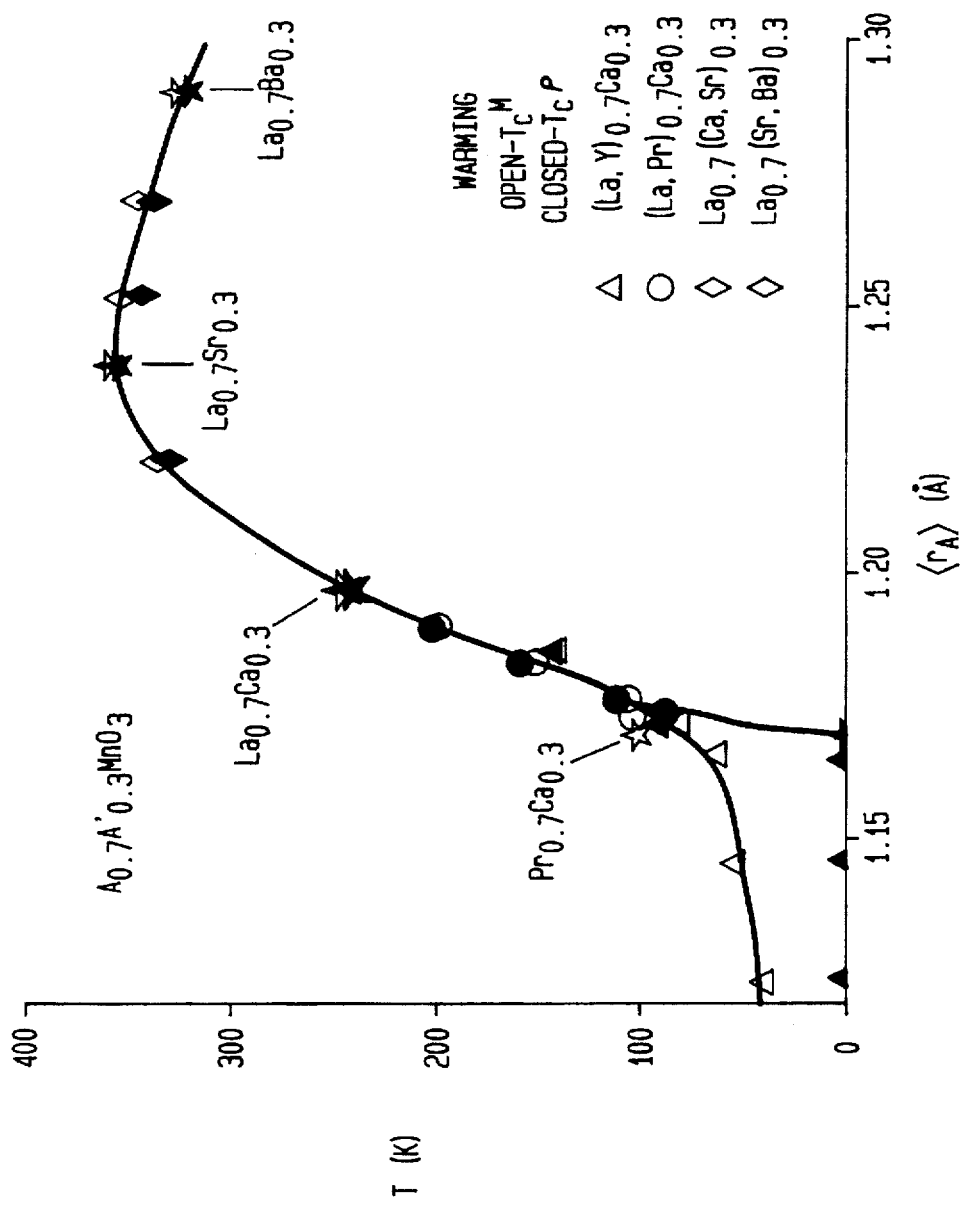
FIG. 2 shows exemplary data on the metal/insulator transition temperature vs. average A-site atomic radius of some Mn-perovskites.

We have found that it is possible, by appropriate choice of composition of the perovskite manganite, to tailor the material characteristics such that the material has high MR sensitivity at a predetermined temperature. In general the perovskite manganites of interest herein are of composition $A_xA'_{1-x}MnO_3$, where $A'$ is one or more of La and the trivalent lanthanide rare earths, A is one or more of Ca, Sr, Ba, Cd, Pb, K, and Na, and x is typically in the range of 0.2–0.4. Typically, by substituting a larger ion for a smaller one on A-sites of the perovskite the maximum MR can be shifted to a higher temperature. In this regard, see H. Y. Hwang et al., *Physical Review Letters*, Vol. 75, p.914 (1995), incorporated herein by reference. See also FIG. 2, which shows exemplary data of $T_{MI}$ vs. $<r_A>$, where the former is the temperature of the metal/insulator transition (defined as the maximum in $d\log(\rho)/dT$), and the latter is the average ionic radius of the A-site ions. Clearly, by increasing $<r_A>$, $T_{MI}$ can be raised to a value at or near room temperature, e.g., within about 50° C. of room temperature (20° C.). It is known that the perovskite manganites typically exhibit large MR and MR sensitivity at and near $T_{MI}$.

As is exemplified by FIG. 1, $\rho(H)$ generally is symmetrical in H for small $H_c$. Thus, it will frequently be advantageous to provide a biasing magnetic field. Although in some cases Earth's magnetic field may serve as biasing field, typically the optional biasing field will be supplied in known manner by a permanent magnet or an electromagnet. The biasing magnet typically will be selected such that, typically, $\rho(H)$ of the MR element is at a steep portion of the $\rho(H)$ vs. H curve.

Figure 3:
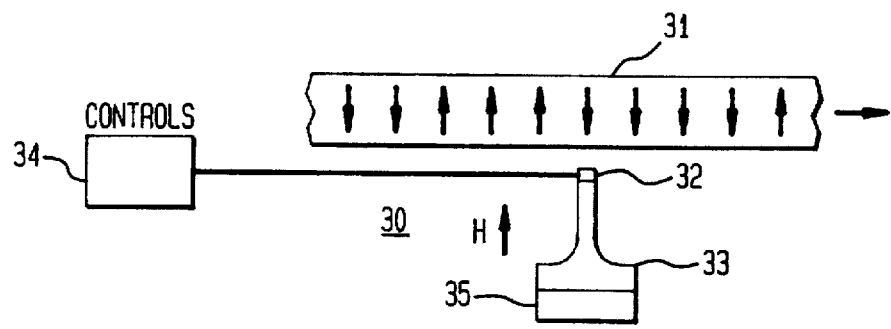
FIGS. 3 and 4 schematically depict an exemplary embodiment of the invention, namely, apparatus for reading out information stored on a magnetic tape.
Figure 4:
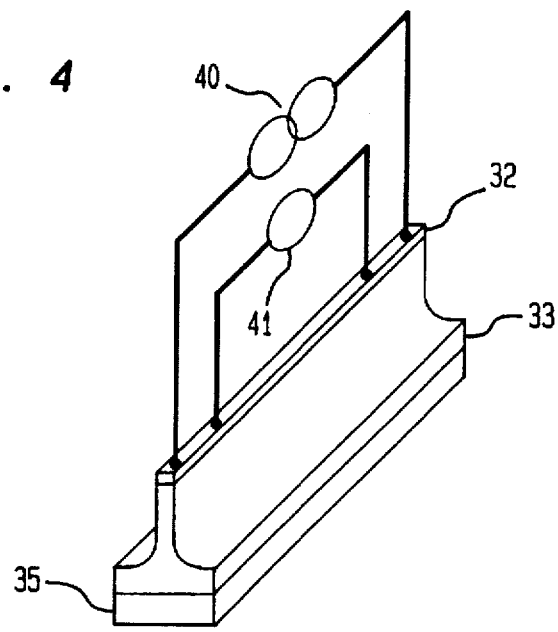

FIGS. 3 and 4 schematically depict an exemplary embodiment of the invention, namely, apparatus 30 that senses variations of magnetization in magnetic storage medium 31 (e.g., a magnetic tape) and provides a responsive signal. The arrows in medium 31 indicate magnetization direction and arrow H indicates the general direction of the biasing field. Those skilled in the art will appreciate that the biasing field has to be selected such that it has negligible effect on the state of magnetization of the magnetic storage medium. Numerals 32–35 refer, respectively, to the MR element, the soft magnetic member, conventional control and read-out electronics, and biasing magnet. The MR element is within the magnetic field of the magnetic member and therefore experiences an effective field that is greater than the field that is created by the storage medium alone, in the absence of the soft magnetic member. The shape of the magnetic member is selected to yield high detection sensitivity, as a consequence of its relatively small demagnetization factor, as well as the small width of the MR element. It will be understood that MR element 32 can be a macroscopic body, a thin film or a thick film.

During operation of the embodiment, storage medium 31 is moved relative to the MR element 32 (exemplarily a perovskite manganite body), whereby element 32 is exposed to a time-varying magnetic field. The variations result in varying resistance of the MR element, which is sensed by conventional means, schematically shown to include a current source 40 and voltage-responsive means 41.

Figure 5:
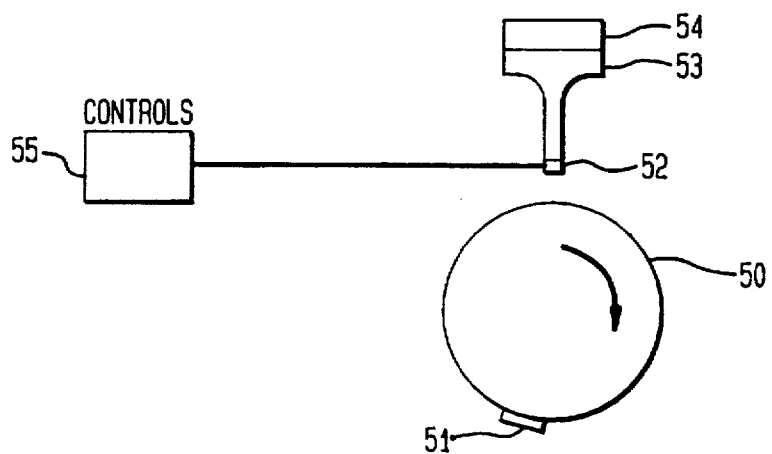
FIG. 5 schematically shows a further exemplary embodiment, namely, apparatus for contact-free sensing rotation of a rotating member.

FIG. 5 schematically depicts a further exemplary embodiment of the invention, namely, apparatus for monitoring the rotational speed of rotating machinery, e.g., rotating shaft 50. A quantity of magnetic material, (e.g., a thin film of conventional magnetic material, e.g., barium ferrite) is disposed on shaft 50, with passage of the magnetic material by MR element 52 being sensed. Numerals 53–55 refer to the soft magnetic body, the optional biasing magnet, and the conventional control means, respectively.

If the rotating member does not have circular symmetry (e.g., is a gear) then magnetic marker element 51 may not be necessary.

The discussion so far has been in terms of a macroscopic MR element and a macroscopic soft magnetic member disposed in proximity thereto. However, the invention is not so limited. For instance, the invention can also be embodied in apparatus that comprises a body that comprises both MR particles and soft magnet particles, or that comprises a body that comprises one or more thin layers of MR material and one or more layers of soft magnetic material.

The former will contain more than about 15% by volume MR particles (e.g., perovskite manganite particles) such that a stable current can flow through the body. The soft magnetic particles will typically be dielectric particles, e.g., ferrite particles. The particles will be mixed, and a body will be formed by any appropriate means, e.g., by provision of an appropriate binder material, such as an epoxy, or by appropriate heat treatment.

A body that comprises a layer (or layers) of MR material and a layer (or layers) of soft magnetic material can be formed by known techniques, e.g., laser ablation, if the layers are thin films, or by thick film techniques. For all cases the MR bodies (particles or layers) will be in close proximity to soft magnet bodies (particles or layers, respectively), such that the soft magnet bodies can serve to increase the magnetic field experienced by the MR bodies, resulting in increased MR at low applied magnetic fields.

Exemplary MR elements were produced as follows: After determination of the desired composition, stoichiometric proportions of the appropriate rare earth oxides, alkali earth carbonates and manganese oxide were mixed and pelletized, followed by calcination for 5–30 hours in the temperature range from 1200°–1450° C. The resulting material typically was comminuted, pelletized and calcined. This was repeated until x-ray examination indicated that phase purity have been achieved. The thus produced single phase perovskite manganite powder was then again pelletized, and sintered for 5–30 hours in the range 1200°–1450° C. in air. This preparation technique is conventional. MR elements were cut from the thus produced sintered pellets.

We also produced single crystal MR elements by a floating zone technique, which involved melting a small portion of a sintered feed rod (produced as described above) with a Xenon lamp, and moving the molten zone slowly along the feed rod. MR elements were then cut from the thus produced single crystal perovskite manganite.

The invention claimed is:

1. An article comprising a magnetic field sensor comprising a magnetoresistive material such that a voltage difference results across at least a portion of the magnetoresistive material, and utilization means that are responsive to the voltage difference;

characterized in that the magnetoresistive material is a perovskite manganite, and the article further comprises a magnetically soft material disposed in close proximity to the magnetoresistive material such that the magnetoresistive material experiences an effective magnetic field that is greater than an applied magnetic field that is to be sensed, wherein the magnetically soft material is a ferrite having an intrinsic coercive field $H_c \leq 100$ Oe.

2. Article according to claim 1, wherein the magnetoresistive material is in the form of a magnetoresistive element that is in contact with a member consisting substantially of said magnetically soft material.

3. Article according to claim 1, wherein the article comprises a magnetoresistive body comprising particles of the magnetoresistive material and particles of the soft magnetic material.

4. Article according to claim 3, wherein the magnetoresistive body comprises more than 15% by volume magnetoresistive material, and wherein the magnetically soft material is a dielectric material.

5. Article according to claim 1, comprising at least one layer of magnetoresistive material and at least one layer of magnetically soft material in contact with the layer of magnetoresistive material.

6. Article according to claim 1, further comprising means for providing a biasing magnetic field.

7. Article according to claim 1, wherein the perovskite manganite has composition $A_x A'_{1-x} MnO_3$, where A' is a member of the group consisting of La, the trivalent rare earths, and combinations thereof, A is a member of the group consisting of Ca, Sr, Ba, Cd, Pb, K, Na, and combinations thereof, and x is in the range 0.2–0.4.

8. Article according to claim 7, wherein A is selected to result in a perovskite manganite having a metal/insulator transition temperature $T_{MI}$ at or near room temperature.

9. An article according to claim 1, wherein the magnetoresistive material has composition $Tl_{2-x}In_xMn_2O_7$ ($0<x<2$) and pyrochlore-type structure.

* * * * *